United States Patent
Parashar et al.

(10) Patent No.: US 10,074,983 B2
(45) Date of Patent: Sep. 11, 2018

(54) PRIMARY POWER GRID FREQUENCY RESPONSE CHARACTERIZATION USING PHASOR MEASUREMENT UNIT DATA

(71) Applicant: General Electric Technology GmbH, Baden (CH)

(72) Inventors: Manu Parashar, Seattle, WA (US); Gurudatha Pai, Kirkland, WA (US); Amarsagar Ramapuram-Matavalam, Ames, IA (US)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 15/682,460

(22) Filed: Aug. 21, 2017

(65) Prior Publication Data

US 2018/0062390 A1    Mar. 1, 2018

Related U.S. Application Data

(60) Provisional application No. 62/379,243, filed on Aug. 24, 2016.

(51) Int. Cl.
*H02J 3/24* (2006.01)
*G01R 19/25* (2006.01)
*H02J 13/00* (2006.01)

(52) U.S. Cl.
CPC ............ *H02J 3/24* (2013.01); *G01R 19/2513* (2013.01); *H02J 13/0006* (2013.01)

(58) Field of Classification Search
None
See application file for complete search history.

(56) References Cited

FOREIGN PATENT DOCUMENTS

| EP | 2 124 311 A1 | 11/2009 |
|---|---|---|
| WO | 2012/060883 A2 | 5/2012 |
| WO | 2014/181081 A1 | 11/2014 |

OTHER PUBLICATIONS

Patel, M., et al., "Real-Time Application of Synchrophasors for Improving Reliability," Proceedings of the National Academy of Sciences, pp. 1-77 (Oct. 18, 2010).

Volkwein, S., "Proper Orthogonal Decomposition: Theory and Reduced-Order Modelling," Lecture Notes, pp. 1-81 (Aug. 27, 2013).

International Search Report and Written Opinion issued in connection with corresponding PCT Application No. PCT/EP2017/071358 dated Nov. 2, 2017.

*Primary Examiner* — Carlos Ortiz Rodriguez
(74) *Attorney, Agent, or Firm* — Amin, Turocy & Watson, LLP

(57) ABSTRACT

The technology is generally directed towards characterizing primary frequency response parameters (e.g., frequency response coefficient, inertia, damping, droop) for an interconnection, region, and power plant utilizing phasor measure unit (PMU) data captured during an event (e.g., a generation trip event) that causes an imbalance in the power grid system. Pre-processing of localized PMU based frequency measurements combined with system identification techniques fit the observed frequency response to estimate parameters such as system inertia, frequency response coefficient, turbine time constant, system damping and governor droop that characterize the interconnection-wide frequency response.

20 Claims, 14 Drawing Sheets

PRIMARY POWER GRID FREQUENCY RESPONSE CHARACTERIZATION USING PHASOR MEASUREMENT UNIT DATA

RELATED APPLICATION

This application claims priority to U.S. Provisional Patent Application No. 62/379,243, filed Aug. 24, 2016, and entitled "Primary Frequency Response Characterization using PMU data", the entirety of which application is hereby incorporated herein by reference.

TECHNICAL FIELD

The disclosed subject matter relates to managing power grid system frequency.

BACKGROUND

A power grid is a complex and dynamic system that is difficult to manage. Among the power grid issues to be managed is an imbalance in the power grid system frequency resulting from a change in generation or load. In general, when the power grid system loses load, the system frequency speeds up, whereas when the power grid system loses generation, the system frequency slows down. Thus, power generation can be adjusted to stabilize the frequency, e.g., to push more power from other generators when one generator fails.

A frequency response standard identified as NERC (North American Electric Reliability Corporation) BAL-003 specifies a frequency response measure using pre- and post- "settling" frequencies. In general, the traditional stabilization metric is that the frequency after the event that caused the frequency imbalance is adjusted to match the frequency that was measured before the event, within a stabilization period on the order of five to ten seconds.

However, the power generation industry is transitioning from mostly being based on a small number of large centralized power plants to a diversified, more complex network that combines conventional power plants, renewable power generation (e.g., solar, wind and the like), energy storage and microgrids. Thus, frequency stabilization performed by power grid system in response to an event that changes the frequency has become a more complex problem.

The above-described background relating to power grid systems is merely intended to provide a contextual overview of some current issues, and is not intended to be exhaustive. Other contextual information may become further apparent upon review of the following detailed description.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, one or more aspects of the technology described herein are directed towards detecting, by a system comprising a processor, a change in power in a power grid system corresponding to an imbalance in the power grid system that changes a frequency associated with the power grid system. In response to detecting the change in power, described herein is determining a system response value based on phasor measurement unit data associated with the power grid and a change in power value representing the change in power, and establishing a boundary region for a frequency response of the power grid system using the phasor measurement unit data. Aspects include using the system response value to obtain transfer function parameters of a transfer function, wherein the transfer function relates the change in power to a change in frequency based on the system response value and the transfer function parameters; and evaluating the frequency response of the power grid system with respect to the boundary region, and in response to the frequency response being determined not to be within the boundary region, varying at least one transfer function parameter of the transfer function parameters until the frequency response is within the boundary region.

Other embodiments and details may become apparent from the following detailed description when taken in conjunction with the drawings.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
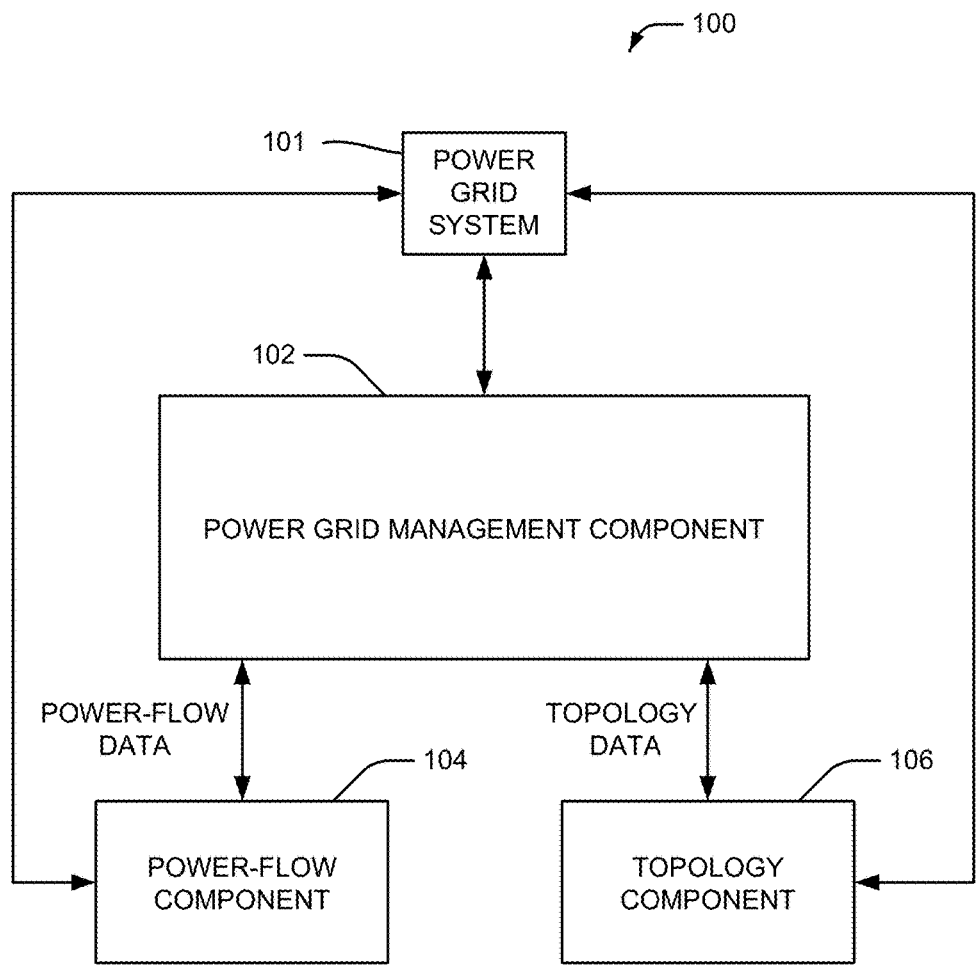
FIG. 1 illustrates a system that facilitates managing energy flow in a power grid system in accordance with aspects of the subject disclosure.

Various aspects of the technology described herein are generally directed towards stabilizing the frequency of a power grid system in response to a detected power grid imbalance, based on phasor measurement unit (PMU) data and other parameters of the system. In general, PMUs comprise grid monitoring devices configured to obtain PMU data ("synchrophasor" measurements) on the order of twenty to sixty times per second. The measurements are synchronized using a common reference clock.

As will be understood, to adjust the frequency, various parameter values are varied to fit a frequency response to a curve. More particularly, varying certain parameter values changes the measured frequency response with respect to a boundary region estimated from the PMU data, with the parameter values re-varied as requested until the frequency response is within boundary region limits.

The technology described herein includes characterizing the primary frequency response parameters (e.g., frequency response coefficient, inertia, damping, droop) for an interconnection, region, and/or power plant utilizing PMU data captured during a generation trip event or the like. The Frequency Response Measure (FRM) describes using pre- and post-"settling" frequencies, which can be obtained from PMU data. Further, the PMU data (due to its higher sampling rate) also captures in-between transient response information that is dictated by the governor and load parameters. Pre-processing of the localized PMU based frequency measurements combined with system identification techniques allows fitting the observed frequency response with a second-order differential question to estimate parameters such as system inertia, frequency response coefficient, turbine time constant, system damping and governor droop that characterize the Interconnection-wide frequency response. Additionally, if the MW flows at the specific power plant's connection point and the boundary flows for a particular region are also monitored through high resolution PMU data, then the frequency response parameters may be calculated for an individual generator or a region respectively.

It should be understood that any of the examples herein are non-limiting. For example, the frequency response parameters described herein may be calculated for any suitable entity capable of being measured, e.g., an individual generator or a region. As such, the technology described herein is not limited to any particular implementations, embodiments, aspects, concepts, structures, functionalities or examples described herein. Rather, any of the implementations, embodiments, aspects, concepts, structures, functionalities or examples described herein are non-limiting, and the technology may be used in various ways that provide benefits and advantages in power grid management concepts in general.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As used in this application, the terms "component," "system," "platform," "interface," "node", "source", "agent", and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

FIG. 1 is an illustration of an example system 100 that facilitates managing energy flow in a power grid system 101 (e.g., an electrical energy distribution system) in accordance with aspects of the technology described herein. The exemplified system 100 includes a power grid management component 102. Additionally, the system 100 may include a power-flow component 104 and/or a topology component 106. The power grid management component 102 may be coupled to and/or integrated with the power-flow component 104 and/or the topology component 106. The power grid management component 102 may be implemented as (and/or may be associated with) a power grid management system.

The power grid management component 102 may identify power grid system events through various power grid system quantities such as power flow, power grid topology, dynamic phase angle separation and/or rate of change of frequency from different parts of the power grid system. In example embodiments, the power grid management component 102 may be integrated with a control center system that manages power transmission and/or power distribution associated with a power grid system (e.g., an electrical energy distribution system). For example, the control center system may measure, analyze and/or control power transmission and/or power distribution associated with the power grid system. The control center system may additionally or alternatively manage other real-time operations associated with the power grid system (e.g., the electrical energy distribution system). Furthermore, the power grid management component 102 may operate using a distribution network model, a model of utility customers where customers are connected with respect to the power grid system (e.g., the electrical energy distribution system), and/or a set of observations associated with the power grid system (e.g., the electrical energy distribution system). In an aspect, the system 100 and/or the power grid management component 102 may be associated with a grid stability assessment system. In another aspect, the system 100 and/or the power grid management component 102 may be associated with an angle-based grid monitoring application.

The power-flow component 104 may generate and/or provide power-flow data as generally represented in FIG. 1. The power grid management component 102 may repeatedly receive the power-flow data from the power-flow component 104. The power-flow data may be associated with voltage measurements and/or current measurements. The power-flow data may be indicative of power-flow measurements that are repeatedly obtained from the power grid system 101 managed by the power grid management component 102. For example, the power-flow data may be indicative of a set of voltage values (e.g., a set of measured voltage values) that are repeatedly obtained from the power grid system 101.

In one example implementation, the power-flow data is phasor data (e.g., phasor voltage data). The power-flow data may be time-tagged and/or location-tagged. The power-flow component 104 may be associated with a set of meters (e.g., smart meters, meter equipment, etc.) and/or communication networks associated with the power grid system 101. The set of meters associated with the power grid system may provide information to the power-flow component 104 (and/or the power grid management component 102) via communication network(s) between the set of meters and the power-flow component 104 (and/or the power grid management component 102). For example, each meter from the set of meters may determine consumption of power (e.g., electric energy) during a certain period of time. Furthermore, the consumption of power determined by each meter from the set of meters may be provided (e.g., transmitted) to the power grid management component 102. In an aspect, the set of meters may provide automatic and/or real-time meter readings to the power-flow component 104 (and/or the power grid management component 102).

The topology component 106 may generate and/or provide topology data as generally represented in FIG. 1. The power grid management component 102 may repeatedly receive the topology data from the power-flow component 104. The topology data may be indicative of a topology for the power grid system 101. For example, the topology data may be indicative of an arrangement and/or a power status of various devices in the power grid system. The topology component 106 may employ connectivity information and/or switching operation information to generate the topology data (e.g., to construct a network topology of the power grid system 10). Furthermore, the topology component 106 may generate and/or provide the topology data based on a location of devices in the power grid system, a connection status of devices in the power grid system and/or a connectivity state of devices in the power grid system. For example, the topology data may be generated based on connectivity statuses and/or connectivity states of devices in the power grid system 101 (e.g., devices that receive and/or process power distributed in throughout the power grid system). The topology data also may indicate which devices in the power grid system 101 are connected to other devices in the power grid system (e.g., where devices in the power grid system are connected, etc.) and/or which devices in the power grid system are associated with a powered grid connection. For example, the topology component 106 may generate the topology data based on a location of devices with respect to the power grid system (e.g., with respect to other devices in the power grid system). The topology data may be generated based on a status of power sources (e.g., a transformer, an electrical substation, etc.) that provide power in the power grid system 101. The topology data also may include the status of the power sources.

Additionally or alternatively, the topology component 106 may generate and/or provide the topology data based on statuses for switching operations associated with devices in the power grid system. A switching operation may be an operation to interrupt, de-energize and/or disconnect a portion of the power grid system 101 (e.g., one or more devices in the power grid system 101). For example, a switching operation may be an operation to open one or more switches (e.g., circuit breakers) associated with a device in the power grid system (e.g., the switching operation may be an operation to disconnect one or more transmission lines associated with a device in the power grid system). It is understood that a switching operation alternatively may be an operation to energize and/or connect a portion of (e.g., one or more devices in) the power grid system 101. For example, a switching operation may be an operation to close one or more switches associated with a device in the power grid system (e.g., the switching operation may be an operation to connect one or more transmission lines associated with a device in the power grid system). Additionally or alternatively, the topology data may identify where and/or how devices are connected (e.g., to other devices, via particular transmission lines, etc.) within the power grid system. Furthermore, the topology data may provide connectivity states of the devices in the power grid system (e.g., based on connection points, based on busses, etc.).

In one or more example implementations, the topology component 106 may determine connectivity information and/or switching operation information associated with the power grid system 101 based on reports associated with the power grid system 101. The reports may be associated with devices and/or particular locations associated with the power grid system 101. In an aspect, the reports may be generated based on phone calls and/or voice logs received from user identities (e.g., customers) in the power grid system. For example, a customer (e.g., a customer with a device linked to a transformer) may call a control center associated with the power grid management component 102 to report a power outage in the power grid system 101. Furthermore, information provided to the control center by the customer may be employed to generate the reports. In one example, the reports may be generated based on interactive voice response data provided by customers during phone calls to the control center. The reports also may be generated based on weather events and/or other information associated with external systems and/or regional transmission organizations. Additionally, the reports may include a list of alarms related to an interruption in the power grid system. In an aspect, the power-flow data and/or the topology data may be generated based on coded (e.g., encoded) feedback data received from devices in the power grid system.

The power grid management component 102 may analyze the power-grid data (e.g., power flows in the power grid system) and/or the topology data. The power grid management component 102 may employ the power-flow data and/or the topology data to manage energy flow in the power grid system. For example, the power grid management component 102 may employ the power-flow data and/or the topology data to detect power transfers and/or power grid outages in the power grid system. A power transfer may be a condition associated with the power grid system where power is transferred (e.g., disproportionally transferred) from a portion of the power grid system to another portion of the power grid system. A power outage may be a condition associated with the power grid system where at least one device in the power grid system does not receive power (e.g., where at least one device in the power grid system is de-energized). The power grid management component 102 also may employ the power-flow data and/or the topology data to assess power transfers and/or power grid outages in the power grid system. Moreover, power grid management component 102 also may employ the power-flow data and/or the topology data to predict voltage angle changes for certain monitored portions of the power grid system (e.g., certain monitored corridors of the power grid system). Therefore, the power grid management component 102 may alleviate power grid stress of the power grid system.

In an embodiment, the power grid management component 102 may identify changes associated with the power-flow data to facilitate management of energy flow in the power grid system. In one example, the power grid management component 102 may identify a rate of change associated with the power-flow data. As such, the power grid management component 102 may identify changes in flow of electrical power in the power grid system. In an aspect, the power grid management component 102 may identify a change in voltage angles associated with the power-flow data. For example, the power grid management component 102 may identify a rate of change in voltage angles associated with the power-flow data. The power grid management component 102 may identify the change in the voltage angles (e.g., the rate of change in the voltage angles) based on defined voltage patterns for the power grid system. Defined voltage patterns may be generated and/or employed for various portions of the power grid system. For example, a defined voltage pattern may be associated with a sector of the power grid system, a corridor of the power grid system a transmission line of the power grid system, a flowgate of the power grid system and/or a device of the power grid system and/or a device. Additionally or alternatively, the power grid management component 102 may identify the change in the voltage angles (e.g., the rate of change in the voltage angles) based on a power flow technique that analyzes power flow associated with the power grid system (e.g., power flow associated with a sector of the power grid system, power flow associated with a corridor of the power grid system, power flow associated with a transmission line of the power grid system, power flow associated with a device of the power grid system, power flow associated with a flowgate of the power grid system, etc.). In one example, the power flow technique may be a Fast Decoupled Power Flow (FDPF) technique. However, it is to be appreciated that the power flow technique may be a different type of power flow technique that analyzes power flow.

In another aspect, the power grid management component 102 may compute voltage angle separation between a first location in the power grid system (e.g., a source location, a first node, a first geographic location, etc.) and a second location in the power grid system (e.g., a sink location, a second node, a second geographic location, etc.) in a power grid system based on the power-flow data and/or the topology data. A transmission line may be coupled between the first location in the power grid system and the second location in the power grid system, for example. Additionally or alternatively, a first device (e.g., a first power grid device, a first transformer device, etc,) may be associated with the first location and a second device (e.g., a second power grid device, a second transformer device, etc.,) may be associated with the second location. In one example, the power grid management component 102 may compute linear sensitivities of the voltage angle separation between the first location in the power grid system and the second location in the power grid system. The power grid management component 102 can, for example, model linear sensitivities of the voltage angle separation between the first location in the power grid system and the second location in the power grid system using a flowgate device with respect to a set of defined branch contingencies associated with the power grid system (e.g., a set of predetermined N-1 branch contingencies). A defined branch contingency may be a portion of the power grid system such as, for example, a transmission line, a power grid device (e.g., a transformer device), etc. The power grid management component 102 also may employ line outage distribution factors and/or line outage angle difference sensitivity values to compute linear sensitivities of the voltage angle separation between the first location in the power grid system and the second location in the power grid system. In example embodiments, the power grid management component 102 may compute predicted values of the voltage angle separation between the first location in the power grid system and the second location in the power grid system based on the power-flow data and/or the topology data. The power grid management component 102 may compute predicted values of the voltage angle separation for the set of defined branch contingencies associated with the power grid system (e.g., all branch contingencies in the set of predetermined N-1 branch contingencies). Furthermore, the power grid management component 102 may determine a worst possible branch contingency for the power grid system.

Figure 2:
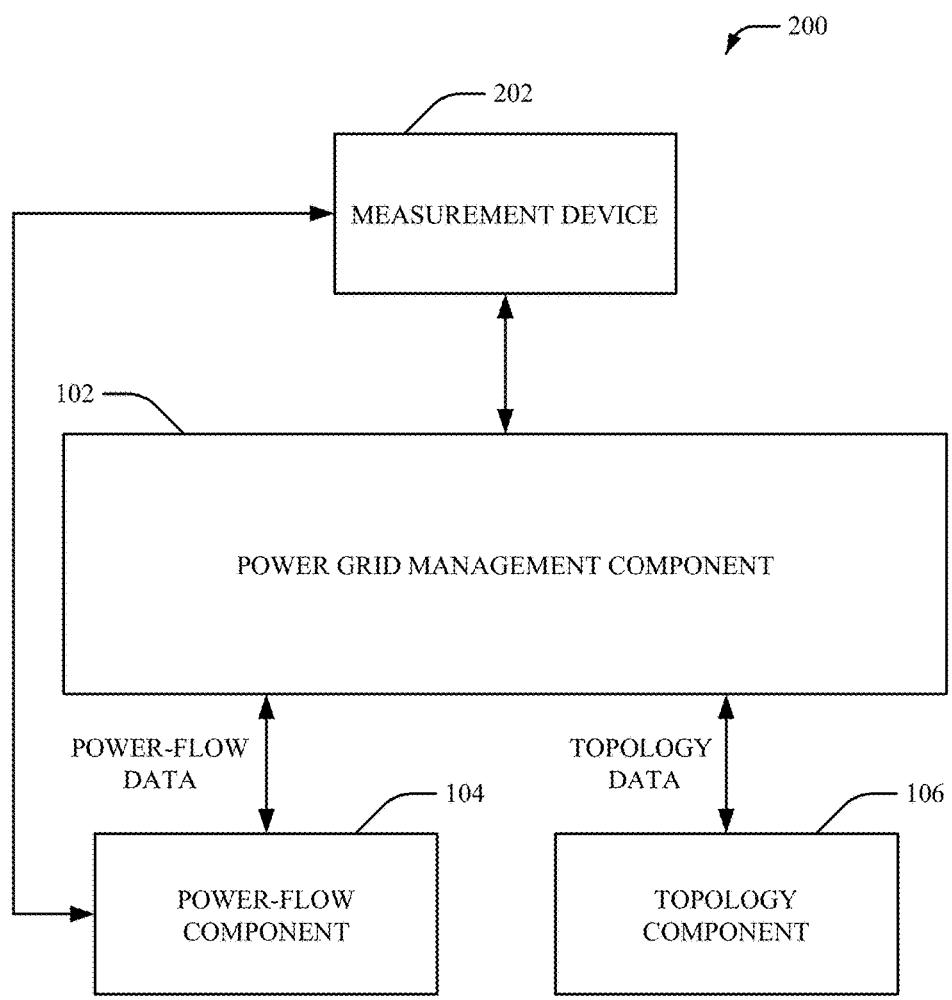
FIG. 2 illustrates another system that facilitates managing energy flow in a power grid system in accordance with aspects of the subject disclosure.

FIG. 2 is a diagram of an example system 200 in accordance with aspects of the subject disclosure. System 200 includes the power grid management component 102. Additionally, the system 200 can include the power-flow component 104, the topology component 106 and/or a measurement device 202. It is to be appreciated that the measurement device 202 can be implemented as more than one measurement device and/or associated with more than one measurement device. In general, the measurement device 202 is configured to obtain, monitor, determine and/or analyze electrical characteristics and/or electrical parameters associated with the power grid system 101 (FIG. 1). The measurement device 202 can be a device such as, for example, a phasor measurement device (e.g., a phasor measurement unit). In one example, the measurement device 202 can obtain synchrophasor measurements. Additionally or alternatively, the measurement device 202 can be a monitoring device. However, it is to be appreciated that the measurement device 202 can additionally include, or alternatively be implemented as, another type of device to obtain, monitor and/or determine electrical characteristics associated with the power grid system 101 (FIG. 1). The measurement device 202 can also include and/or be associated with a protection relay, a global positioning system (GPS), a phasor data concentrator, communication capabilities and/or other functionalities.

The measurement device 202 may be coupled to at least a portion of the power grid system associated with the power grid management component 102. For example, the measurement device 202 can be coupled to a transmission line, a flowgate, and/or a device included in the power grid system 101. Furthermore, the measurement device 202 can be associated with a particular sector of the power grid system and/or a particular corridor of the power grid system.

The measurement device 202 may be configured to provide real-time or near real-time measurements for electrical characteristics and/or electrical parameters associated with the power grid system. The measurement device 202 can, for example, repeatedly obtain measurements from the power grid system. Measurements obtained by the measurement device 202 may be associated with the power-flow data. For example, the measurement device 202 can repeatedly obtain the power-flow data and/or data that is employed to generate the power-flow data. In aspect, the measurement device 202 can repeatedly obtain the measurements from the power grid system during an interval of time that is less than one second. For example, the measurement device 202 can repeatedly obtain sub-second measurements from the power grid system. In an aspect, data generated and/or obtained by the measurement device 202 can be coded data (e.g., encoded data) associated with the power grid system.

Figure 3:
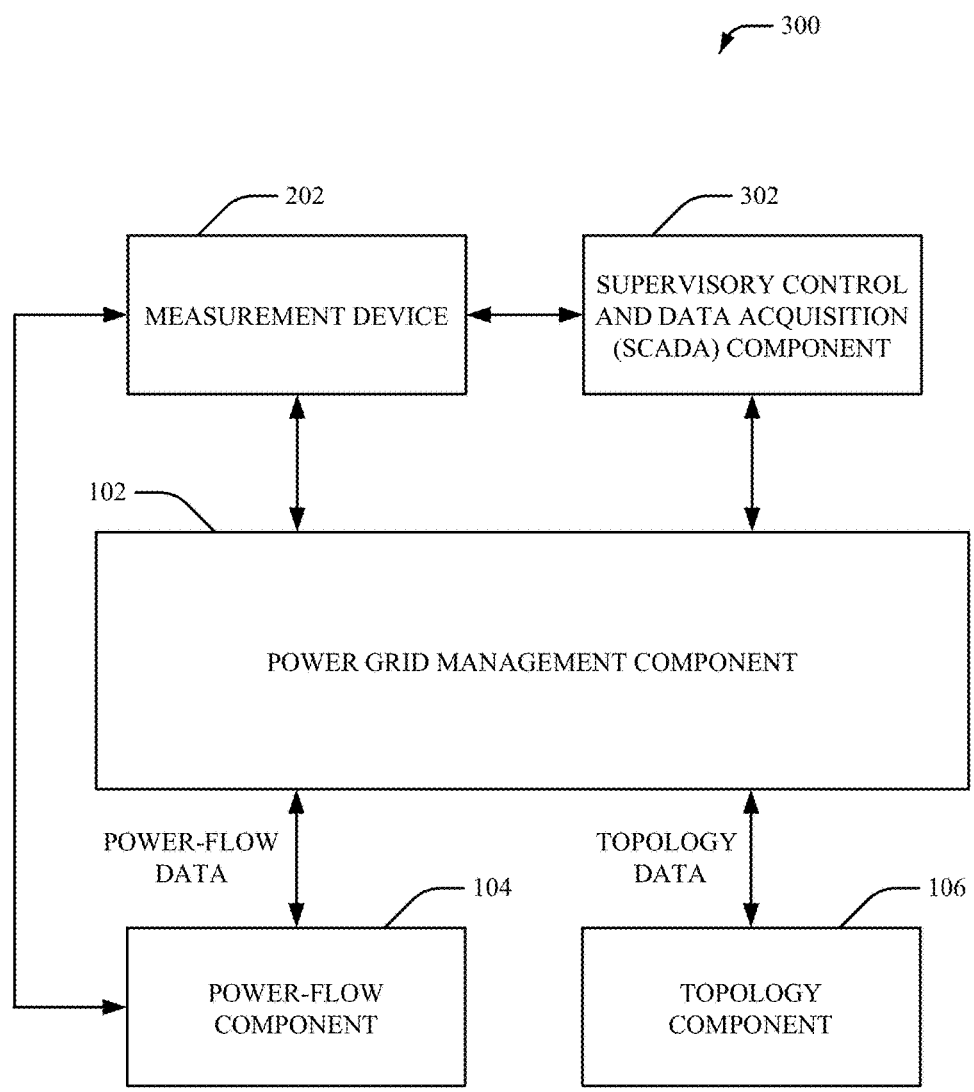
FIG. 3 illustrates yet another system that facilitates managing energy flow in a power grid system in accordance with aspects of the subject disclosure.

FIG. 3 is a diagram of an example system 300 in accordance with aspects of the subject disclosure. System 300 includes the power grid management component 102. Additionally, the system 300 can include the power-flow component 104, the topology component 106, the measurement device 202 and/or a supervisory control and data acquisition (SCADA) component 302. The SCADA component 302 is generally associated with a system for monitoring and/or controlling devices in the power grid system. For example, the SCADA component 302 may provide real-time information (e.g., real-time information associated with the devices in the power grid system) and/or sensor information (e.g., sensor information associated with the devices in the power grid system) to the power grid management component 102. In an aspect, the SCADA component 302 may control automated processing of alarms in the power grid system, obtain and/or analyze measurement data (e.g., associated with the measurement device 202 and/or another measuring device) in the power grid system, monitor relay data associated with the power grid system, monitor oscillation data associated with the power grid system, manage limits (e.g., set point limits) associated with the power grid system, manage alarms and/or overloads associated with the power grid system, manage tagging data for equipment associated with the power grid system, manage archiving of data associated with the power grid system, manage faults associated with the power grid system (e.g., via a fault location isolation and service restoration (FLISR) system), monitor and/or study the power grid system, and/or manage other data associated with the power grid system. In another aspect, the SCADA component 302 may be associated with remote terminal units connected to sensors in the power grid system, programmable logic controllers connected to sensors in the power grid system and/or a communication system (e.g., a telemetry system) associated with the power grid system. In yet another aspect, the measurement device 202 and/or the SCADA component 302 may be real-time systems for providing real-time data (e.g., real-time data associated with devices, meters, sensors and/or other equipment in the power grid system) to the power grid management component 102. For example, the measurement device 202 and/or the SCADA component 302 may provide real-time measurement data, real-time operational data and/or real-time feedback data to the power grid management component 102.

In yet another aspect, the SCADA component 302 can manage events associated with the power grid system. The SCADA component 302 can also generate device state data associated with determined events and/or tracked events in the power grid system. Device state data generated by the SCADA component 302 can additionally be associated with a tag (e.g., an identifier) for a device in the power grid system. The SCADA component 302 may also obtain and/or analyze measurement data for a device in the power grid system, monitor relay data associated with the power grid system, monitor oscillation data associated with the power grid system, manage limits (e.g., set point limits) associated with the power grid system, manage alarms and/or overloads associated with the power grid system, archiving data associated with a device in the power grid system, manage faults associated with a device in the power grid system, etc. In example embodiments, data determined and/or generated by the SCADA component 302 may be employed by the power-flow component 104 and/or the topology component 106 to facilitate generation of the power-flow data and/or the topology data. Additionally or alternatively, data determined and/or generated by the SCADA component 302 may be employed by the power grid management component 102 to facilitate management of energy flow in the power grid stem.

Figure 4:
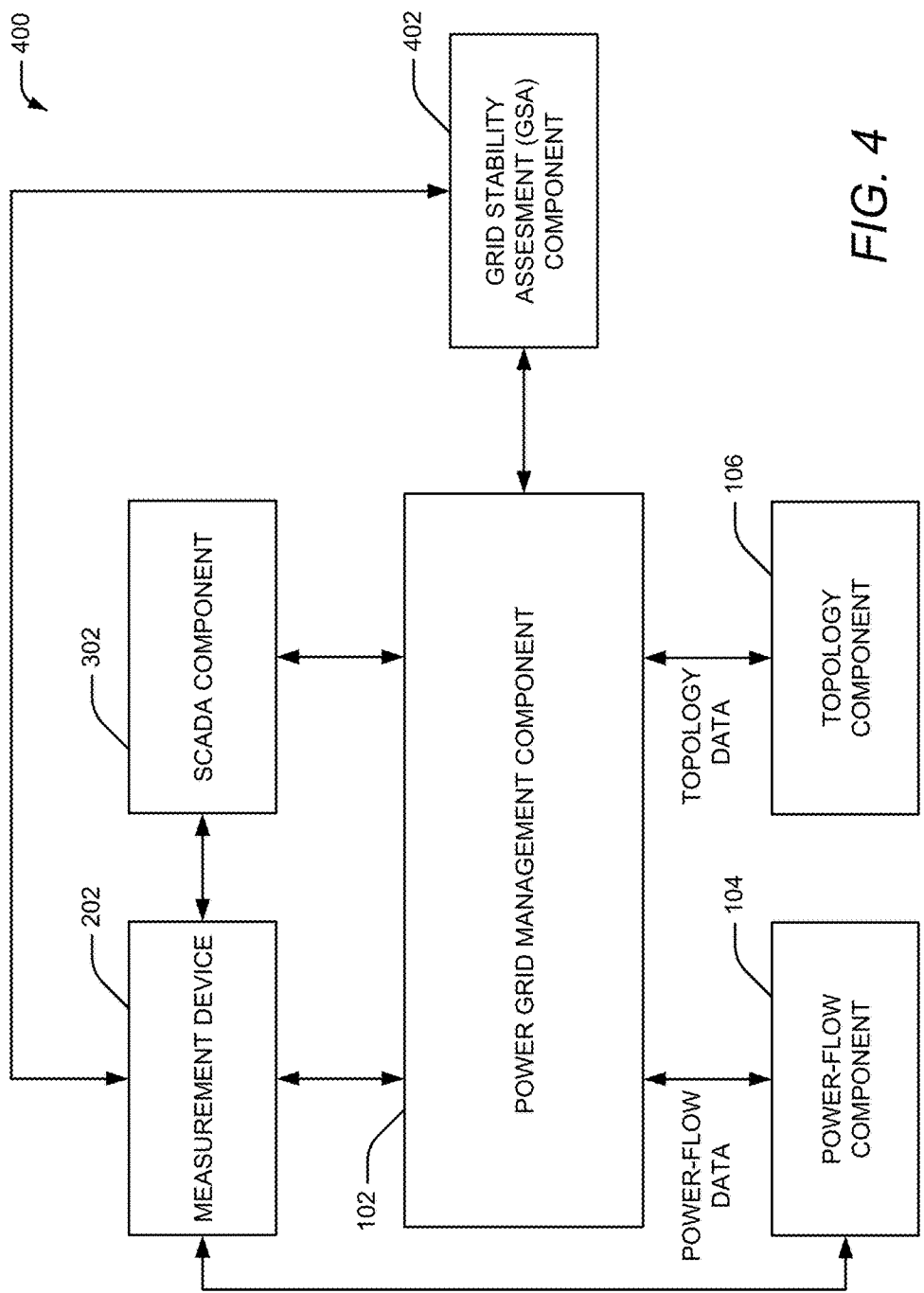
FIG. 4 illustrates yet another system that facilitates managing energy flow in a power grid system in accordance with aspects of the subject disclosure.

FIG. 4 is a diagram of an example system 400 in accordance with aspects of the subject disclosure. System 400 includes the power grid management component 102. Additionally, the system 400 can include the power-flow component 104, the topology component 106, the measurement device 202, the SCADA component 302 and/or a Grid Stability Assessment (GSA) component 402. In example embodiments, the GSA component 402 can include the power grid management component 102. The GSA component 402 may be associated with an energy management system for the power grid system, a situational awareness system for the power grid system, a visualization system for the power grid system, a monitoring system for the power grid system and/or a stability assessment system for the for the power grid system. The GSA component 402 may additionally provide real-time analytics based on measurements associated with the power grid system. For example, the GSA component 402 may process real-time data obtained from the measurement device 202 to determine dynamic behavior of the power grid system. In an aspect, the GSA component 402 may generate, determine and/or store a set of defined patterns for the power grid system. For example, the GSA component 402 may generate, determine and/or store different defined patterns for different locations of the power grid system. The set of defined patterns generated by the GSA component 402 may be, for example, a set of defined voltage patterns for the power grid system. Furthermore, a defined pattern from the set of defined patterns can be associated with a transmission line in the power grid system, a device in the power grid system, a sector of the power grid system and/or a corridor of the power grid system.

Figure 5:
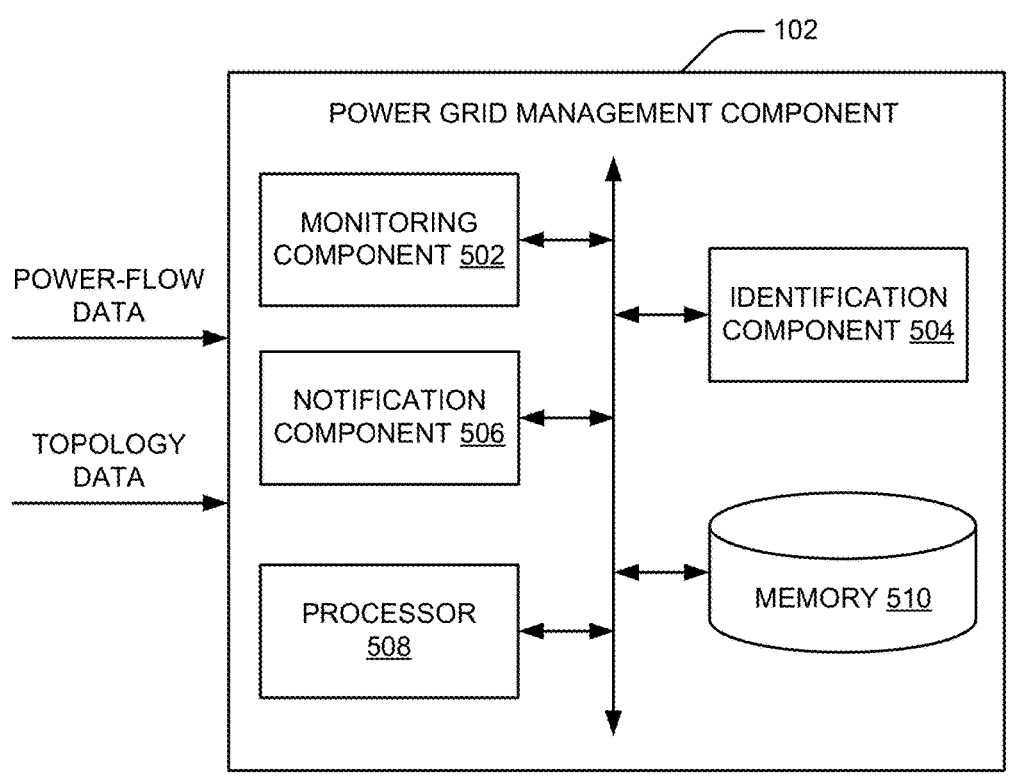
FIG. 5 is a high-level block diagram of an example power grid management component in accordance with aspects of the subject disclosure.

FIG. 5 is a representation of an example power grid management component 102 in accordance with aspects of the subject disclosure. In FIG. 5, the power grid management component 102 includes a monitoring component 502, an identification component 504 and a notification component 506. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the power grid management component 102 may include memory 510 for storing computer executable components and instructions. The power grid management component 102 can further include a processor 508 to facilitate operation of the instructions (e.g., computer executable components and instructions) by the power grid management component 102.

The monitoring component 502 in general generates monitoring data for the power grid system 101 associated with the power grid management component 102. The monitoring component 502 may generate the monitoring data based on the power-flow data (e.g., the power-flow data provided by the power-flow component 104) and/or the topology data (e.g., the topology data provided by the topology component 106). For example, the monitoring data may include at least the power-flow data and/or the topology data. In one example, the power-flow data and/or the topology data may be encoded in the monitoring data.

The identification component 504 may identify a change in the power-flow data, that is, an imbalance in the system. For example, based on the monitoring data, the identification component 504 may identify a change in a voltage, frequency, current, voltage angle and/or the like associated with the power-flow data. The identification component 504 can also determine, based on the topology data, a location in the power grid system that is associated with the change. In an example embodiment, the identification component 504 can identify a rate of change in the power-flow data. The identification component 504 can also determine, based on the topology data, a location in the power grid system that is associated with the rate of change in the power-flow data. A location in the power grid system that is determined by the identification component 504 can include, but is not limited to a particular transmission line in the power grid system, a particular device in the power grid system, a particular sector of the power grid system and/or a particular corridor of the power grid system that is associated with the change. A location in the power grid system can also be associated with a geographic location (e.g., a GPS location, etc.).

The identification component 504 can identify a change in the power-flow data and/or a rate of change in the power-flow data based on a set of defined patterns for the power grid system. For example, different defined patterns for different locations of the power grid system can be generated and/or stored by the identification component 504 or another component (e.g., the SCADA component 302, the GSA component 402, etc.) in communication with the identification component. The set of defined patterns can be, for example, a set of defined voltage patterns for the power grid system. Furthermore, a defined voltage pattern from the set of defined voltage patterns can be associated with a transmission line in the power grid system, a device in the power grid system, a sector of the power grid system and/or a corridor of the power grid system.

Moreover, the identification component 504 may identify a change in the power-flow data and/or a rate of change in the power-flow data based on one or more power flow analysis techniques that analyze power flow in the power grid system. For example, the one or more power flow analysis techniques may analyze a portion of the power-flow data associated with a transmission line in the power grid system, a device in the power grid system, a sector of the power grid system and/or a corridor of the power grid system. In a non-limiting example, the identification component 504 may identify a change in the power-flow data and/or a rate of change in the power-flow data based on a FDPF technique. The one or more power flow analysis techniques employed by the identification component 504 may, for example, compare the power-flow data to the set of defined patterns. Accordingly, the identification component 504 may identify a change in the power-flow data and/or a rate of change in the power-flow data, a power outage associated with the power grid system and/or congestion associated with the power grid system.

In an aspect, the identification component 504 may concurrently identify different changes and/or different rate of changes (e.g., different changes in voltage angles and/or different rate of changes in voltage angles) in the power grid system based on the power-flow data. For example, the identification component 504 may identify a first change and/or a first rate of change associated with a transmission line of the power grid system based on the power-flow data. At approximately a corresponding instance in time (e.g., for a time-stamp that at least approximately corresponds to a time-stamp associated with the first change and/or the first rate of change), the identification component 504 may additionally identify a second change and/or a second rate of change associated with another transmission line of the power grid system, a device of the power grid system, a sector of the power grid system and/or a corridor of the power grid system based on the power-flow data. As such, the identification component 504 may identify other change (s) in other voltage angle(s) for a device associated with a transmission line, a transmission line of the power grid system, a sector of the power grid system and/or a corridor of the power grid system based on the power-flow data.

In yet another aspect, the monitoring component 502 may repeatedly obtain the power-flow data and/or the topology data during a first period of time. Furthermore, the identification component 504 may identify a change in the power-flow data and/or a rate of change in the power-flow data during a second period of time. For example, the identification component 504 may identify a change in the power-flow data and/or a rate of change in the power-flow data based on historical data (e.g., historical power-flow data stored in a data store) that is obtained prior to obtaining the power-flow data. In another example, the identification component 504 may identify a change in the power-flow data and/or a rate of change in the power-flow data based on a subset of the power-flow data (e.g., a subset of the power-flow data that is associated with a short period of time than the power-flow data currently obtained by the monitoring component 502).

The notification component 506 may generate a notification for a graphical user interface in response to a determination that a change in the power-flow data and/or a rate of change in the power-flow data satisfies a defined criterion. For example, the notification component 506 may generate a notification for a graphical user interface in response to a determination that a change in the voltage angle associated with the power-flow data satisfies a defined criterion and/or a determination that a rate of change in a voltage angle associated with the power-flow data satisfies a defined criterion. In an aspect, the notification component 506 may modify a portion of a graphical user interface in response to a determination that a change in the power-flow data and/or a rate of change in the power-flow data satisfies a defined criterion. The defined criterion may be, for example, that a change in the power-flow data and/or a rate of change in the power-flow data corresponds to a power outage in the power grid system. In another example, the defined criterion may be that a change in the power-flow data and/or a rate of change in the power-flow data corresponds to abnormal energy flow in the power grid system. In yet another example, the defined criterion may be that a change in the power-flow data and/or a rate of change in the power-flow data corresponds to condition in the power grid system where an amount of a power supply to a device of the power grid system is below a defined threshold level. In yet another example, the defined criterion may be that a change in the power-flow data and/or a rate of change in the power-flow data corresponds to a violation with respect to defined voltage angle separation limits. In yet another example, the defined criterion may be that a change in the power-flow data and/or a rate of change in the power-flow data corresponds to a defined congestion level associated with the power grid system.

In example embodiments, the notification component 506 may generate information related to a set of actions for modifying a portion of the power grid system in response to a determination that a change in the power-flow data and/or a rate of change in the power-flow data satisfies a defined criterion. For example, the set of action may be a set of steps to perform with respect to modifying a portion of the power grid system. The set of actions may facilitate a recovery of the power grid system in response a change in the power-flow data and/or a rate of change in the power-flow data that satisfies a defined criterion. Additionally or alternatively, the notification component 506 may generate information related to a power outage in the power grid system and/or congestion associated with the power grid system in response to a determination that a change in the power-flow data and/or a rate of change in the power-flow data satisfies a defined criterion.

While FIGS. 1-5 depict separate components in system 100, 200, 300, 400 and 500, it can be readily appreciated that the components may be implemented in a common component. Further, it is understood that the design of system 100, 200, 300, 400 and/or 500 may include other component selections, component placements, etc., to facilitate management of a power grid system (e.g., an electrical energy distribution system).

Figure 6:
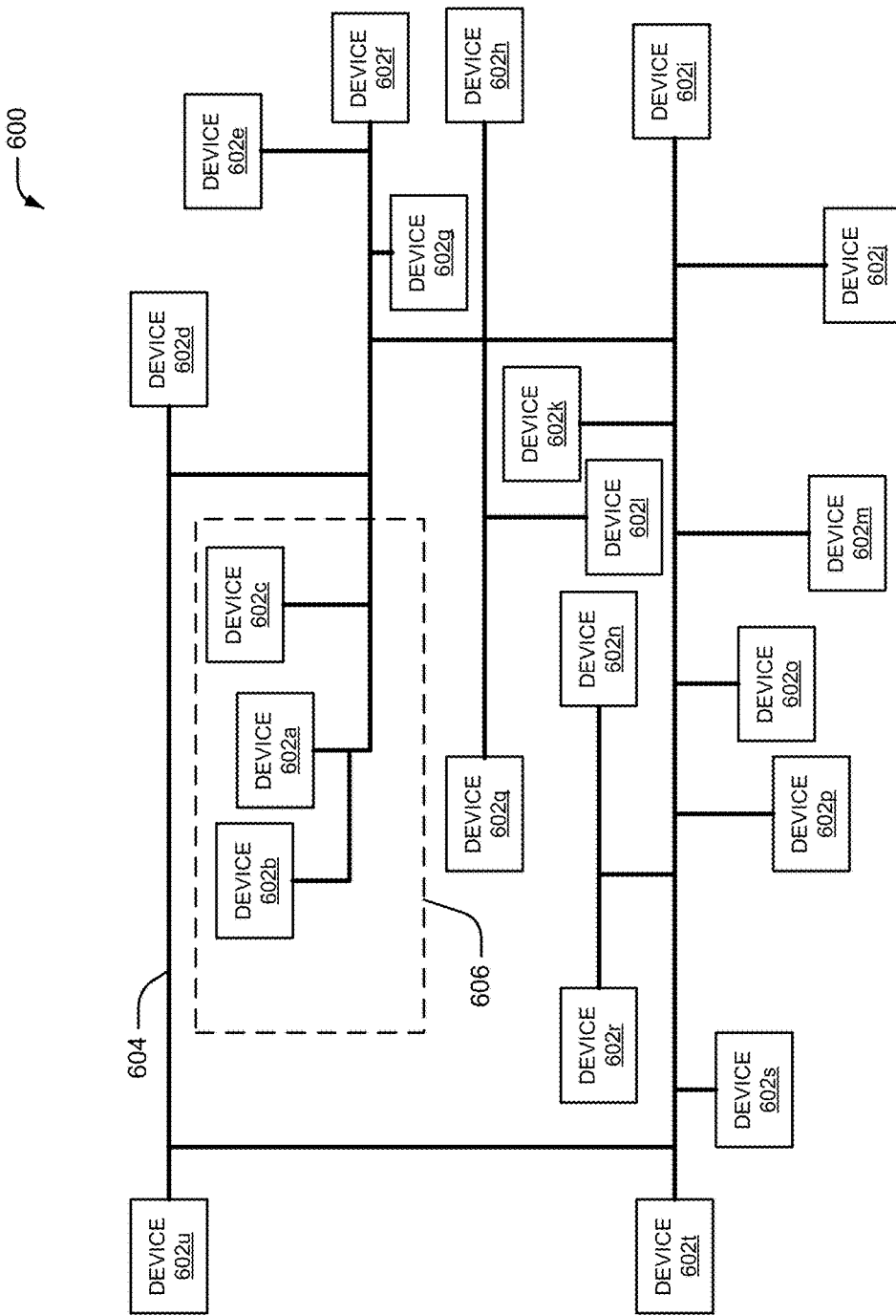
FIG. 6 illustrates an example power grid system in accordance with aspects of the subject disclosure.

FIG. 6 illustrates a power grid system 600 in accordance with aspects of the subject disclosure. For example, the power grid system 600 may be the power grid system 101 of FIG. 1, which may be associated with the power grid management component 102 of FIGS. 1-5. The power grid system 600 as exemplified in FIG. 6 includes devices 602a-u; notwithstanding it is understood that the number of devices shown in the power grid system 600 is merely an example, and that any practical number may be present. Therefore, a power grid system associated with the power grid management component 102 may have a different number of devices than those exemplified. The devices 602a-u may be coupled via a network of transmission lines. For example, device 602u and device 602d may be coupled via a transmission line 604 from a network of transmission lines associated with the devices 602a-u. Furthermore, a subset of the devices 602a-u can be associated with a sector of the power grid system 600. For example, a sector 606 of the power grid system 600 can include device 602a, device 602b and device 602c. In one example, the sector 606 can be a corridor of the power grid system 600.

In a non-limiting example, the power-flow data provided by the power-flow component 104 and/or the topology data provided by the topology component 106 can be associated with a power grid system such as, for example, the power grid system 600. For example, the power-flow data provided by the power-flow component 104 and/or the topology data provided by the topology component 106 can be associated with at least one device from the devices 602a-u. In another example, the power-flow data provided by the power-flow component 104 and/or the topology data provided by the topology component 106 can be associated with the transmission line 604 and/or one or more other transmission lines in the power grid system 600. In yet another example, the power-flow data provided by the power-flow component 104 and/or the topology data provided by the topology component 106 can be associated with the sector 606 and/or one or more other sectors in the power grid system 600.

Turning to aspects related to the frequency response of a power grid system, the frequency response of the power grid system 101 can be modeled as a relationship between a change in power input to a transfer function and a change in frequency, $\Delta P \rightarrow G(s) \rightarrow \Delta f$ where $G(s)$ is the transfer function of the system that transforms the change in power $\Delta P$ to the change in the frequency $\Delta f$ of the system. In general, a change in power and thus frequency results from an imbalance in the system corresponding to when load changes (e.g., consumer demand increases or decreases) or when generation changes (e.g., a generator fails or comes back up).

One straightforward form of the transfer function $G(s)$ is $$G(s) = \frac{1+sT_t}{\left(\frac{1}{R}+\frac{1}{D}\right)+S\left(\frac{T_t}{D}+\frac{2HS_B}{f_0}\right)+S^2\left(\frac{2HS_B}{f_0}\right)T_t}$$

where $\frac{1}{R}$ is the system droop $\frac{1}{D}$ is the system damping $T_t$ is the turbine time constant $\frac{2HS_B}{f_0}$ is the system inertia These characteristics are well-known power grid system concepts, and their parameter values can be estimated using PMU measurement data in conjunction with the change in power ($\Delta P$), both of which may be obtained as described above. Note that as described in a NERC document entitled "Real-Time Application of Synchrophasors for Improving Reliability," Oct. 18, 2010, PMUs measure voltage, current and frequency and calculate phasors, referred to as phasor data, and each phasor measurement may be GPS time-stamped, resulting in a synchrophasor."

To stabilize the frequency, the time-relevant PMU measurements are selected and filtered, e.g., to remove the data corresponding to frequencies above 1 HZ; (this is user configurable; e.g., 0.5 HZ may be chosen instead as the filter threshold for removal). After filtering, a Proper Orthogonal Decomposition (POD)/Principal Component Analysis) is performed on the filtered data to get the trend information of the frequency response. Using this POD analytics information, a boundary region is established for the given frequency response data.

Next, the system response, $$\frac{1}{\beta} = \frac{1}{R} + \frac{1}{D},$$

is calculated, e.g., using a low pass filter design.

The transfer function $G(s)$ can be re-written as:

$$G(s) = \frac{(\beta + \alpha \cdot s)\omega_n^2}{\omega_n^2 + 2 \cdot \omega_n \zeta \cdot s + s^2}$$

Using the calculated system response $$\frac{1}{\beta}$$

to obtain the value of $\beta$ in the above function, the parameters $\alpha$, $\omega_n$ and $\zeta$ are varied, and the resulting frequency response compared with the chosen boundary region. A "penalty" value is computed for the $\alpha$, $\omega_n$ and $\zeta$ parameters based on deviation from the boundary region. Similarly, a "reward" value is calculated for $\alpha$, $\omega_n$ and $\zeta$ parameters for adherence to the boundary region. These "penalty" and "reward" values are then checked against the pre-defined limits. If the parameters are below the penalty limit and above the reward limit, the parameters are chosen. Otherwise, the parameters are varied again to hone in on the desired response. These operations are described further below with reference to FIG. 11.

Figure 7:
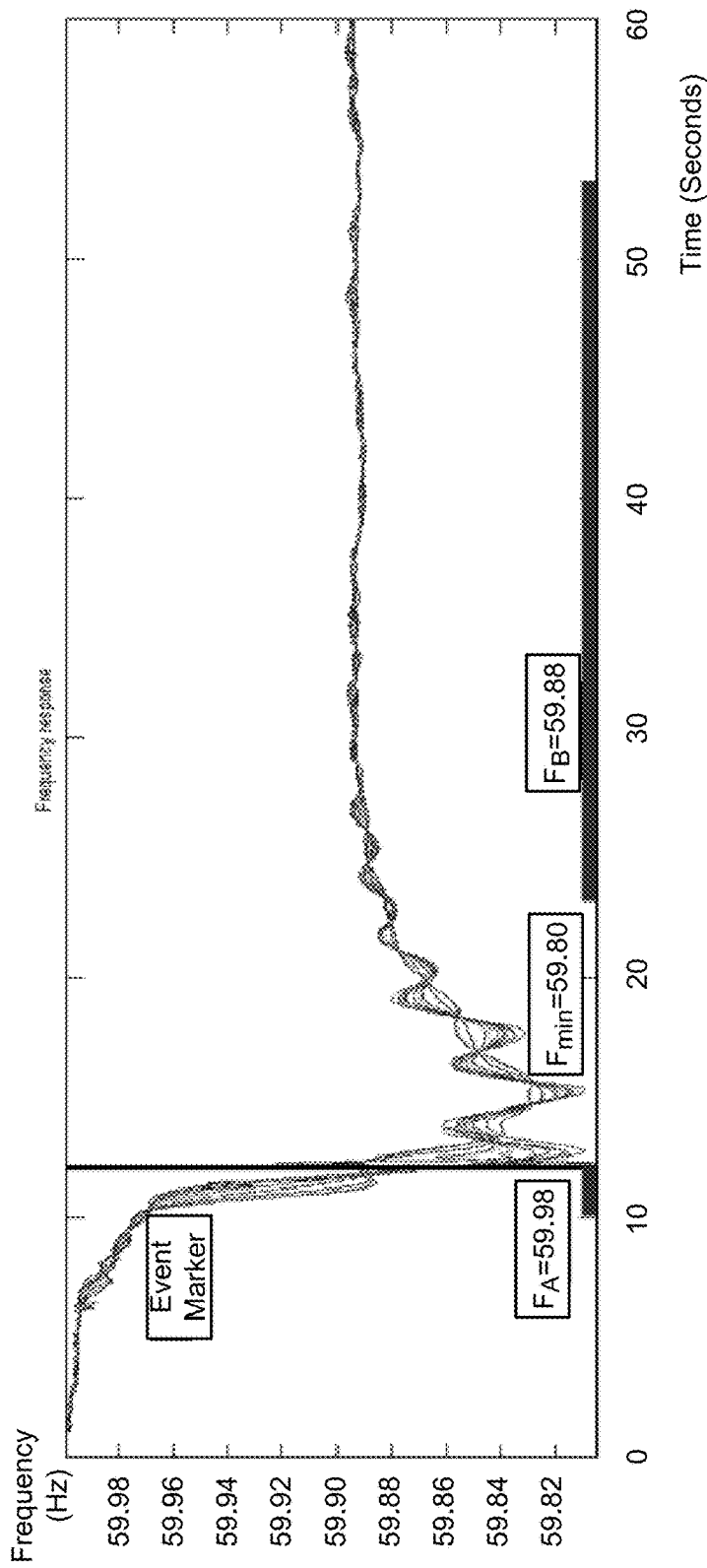
FIGS. 7-9 illustrate example results in graphical form in accordance with aspects of the subject disclosure.

FIG. 7 illustrates in graphical form the frequency response of the system using the calculated system response $(1/\beta)$. As can be seen, the pre-event frequency is calculated to be 59.96 Hz and the post-event frequency is calculated to be 59.88 Hz. The system response is calculated to be 2843 MW/0.1 HZ.

Figure 8:
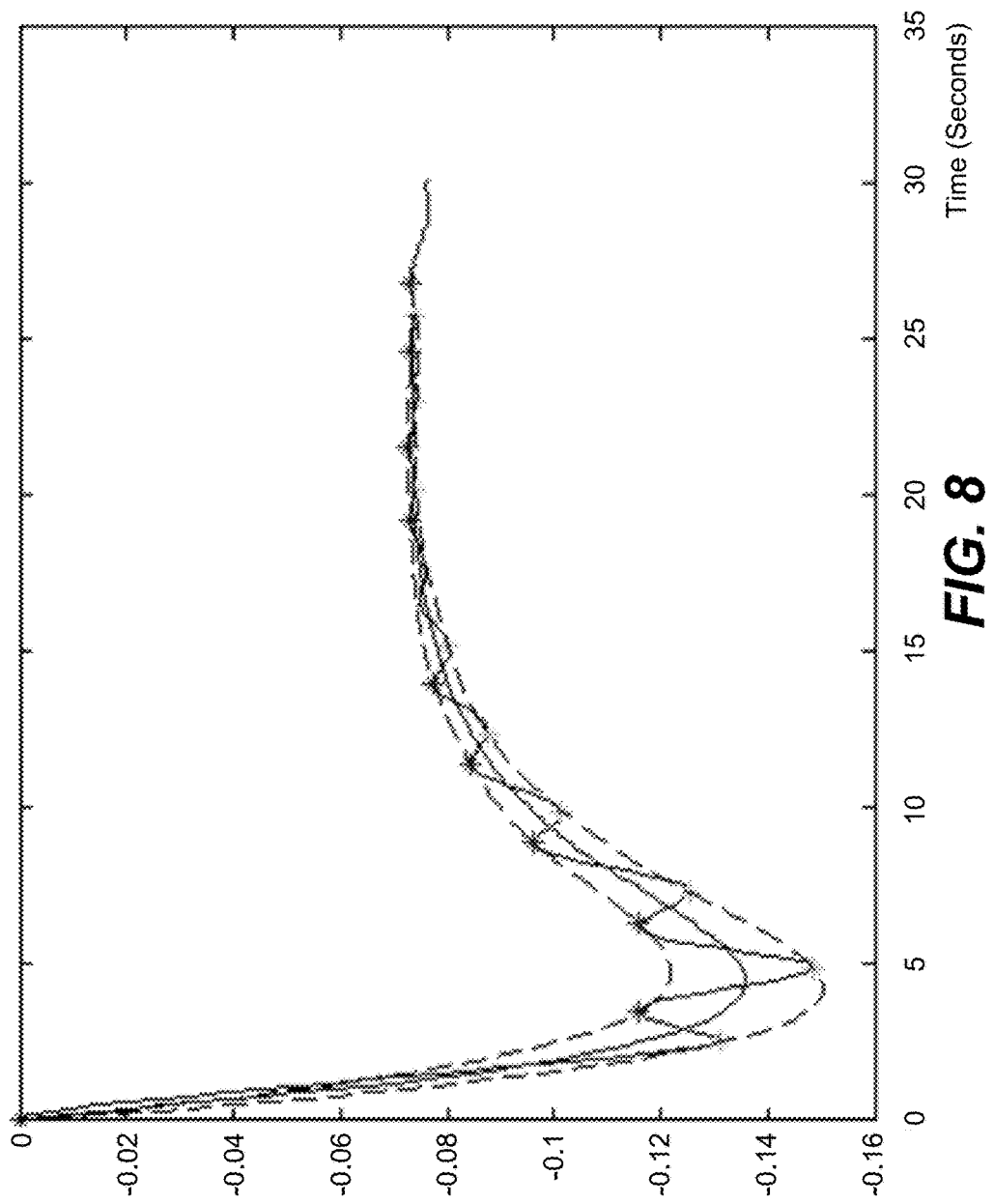

FIG. 8 illustrates, in graphical form, how using the calculated system response $$\left(\frac{1}{\beta}\right),$$

POD analytics are performed to estimate the boundary region of the system response. The boundary region is shown in FIG. 8 via the outer dashed lines surrounding the curve.

Figure 9:
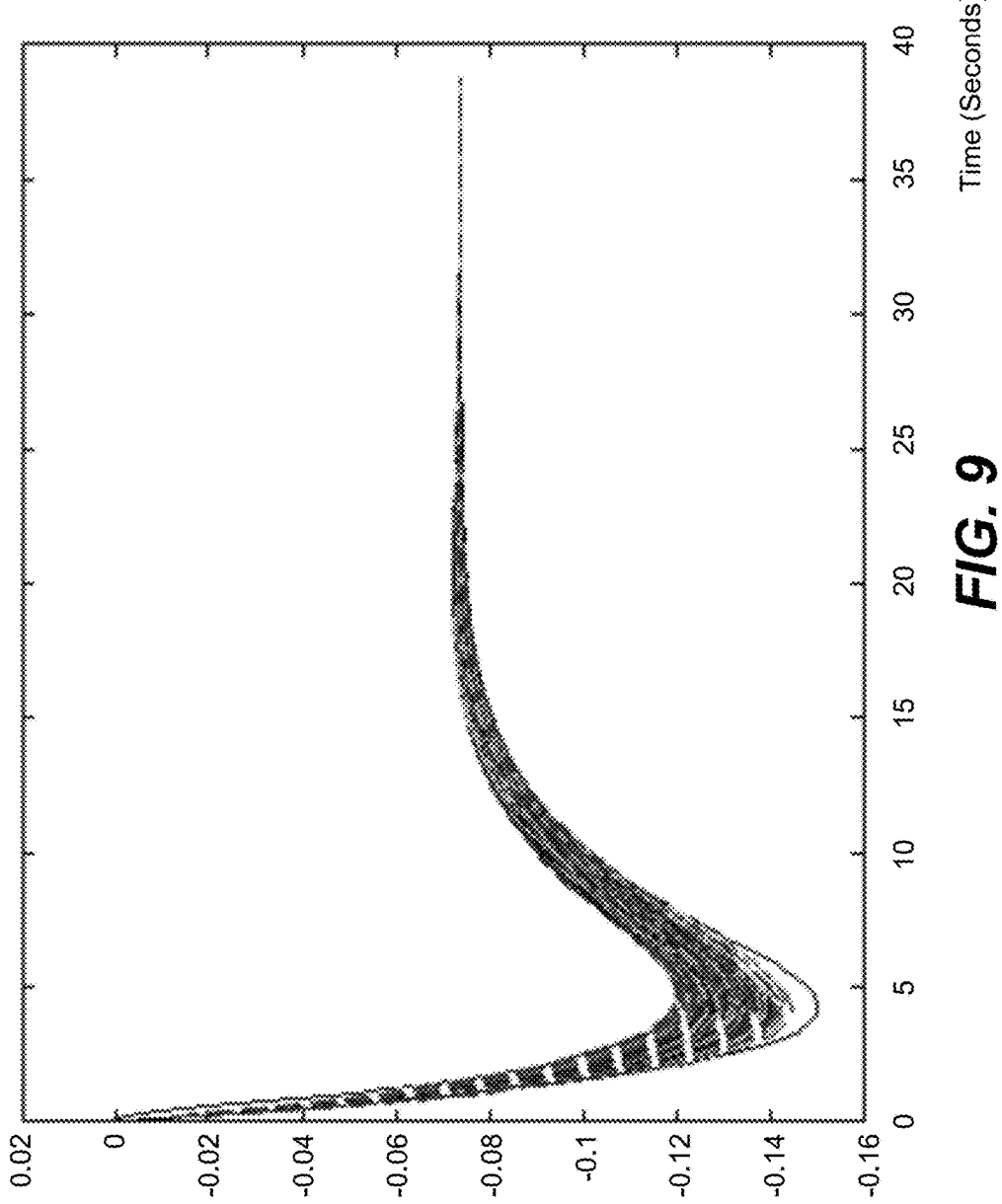

The final response with the estimated parameters is as shown in FIG. 9. It can be seen that each of the frequency responses are within the boundary region.

Figure 10:
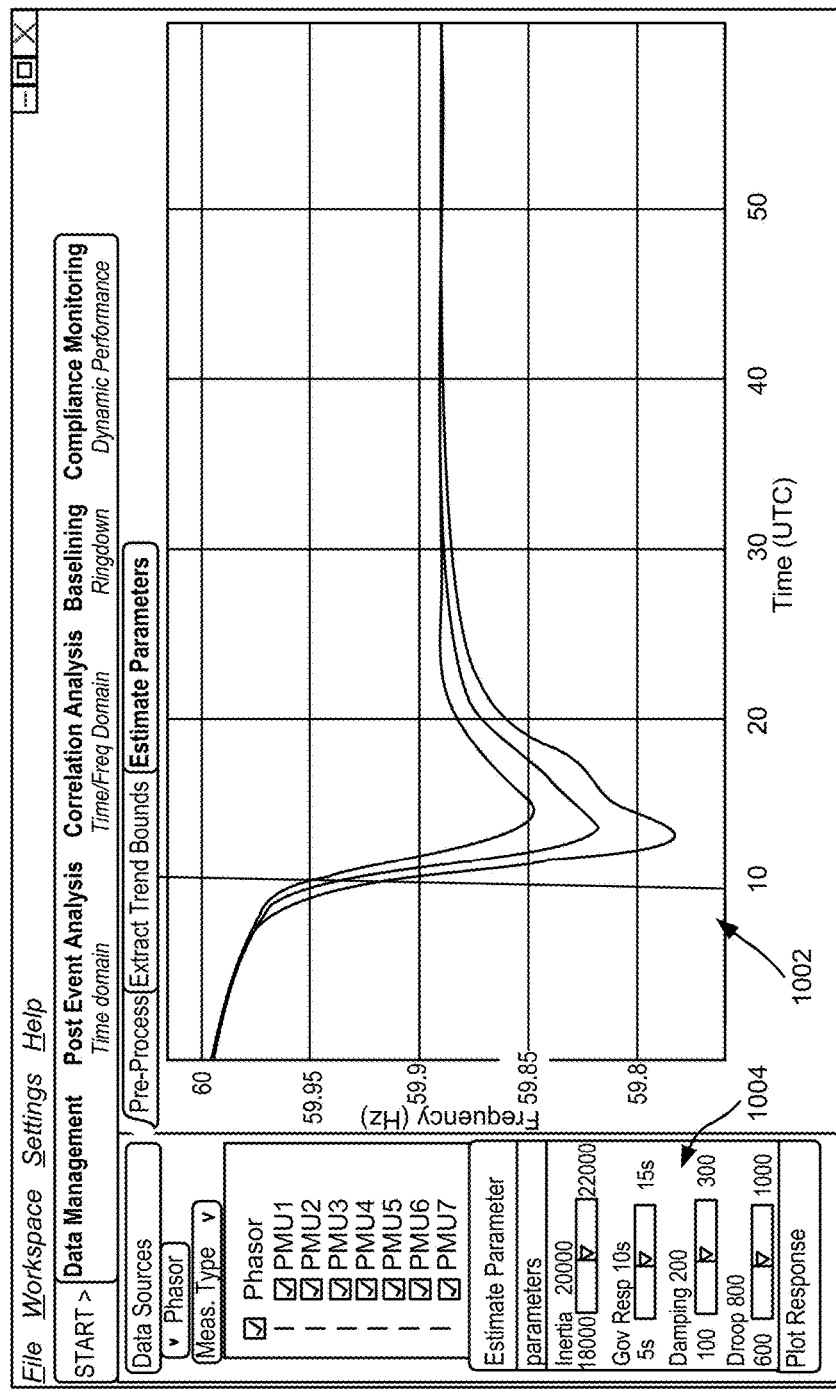
FIG. 10 is an example representation of a graphical user interface in accordance with aspects of the subject disclosure.

FIG. 10 illustrates a graphical user interface 1000 in accordance with aspects of the subject disclosure. For example, the graphical user interface 800 can be generated by and/or associated with the power grid management component 102. Furthermore, the graphical user interface 1000 can be associated with a display of a device (e.g., a computing device). A device associated with the graphical user interface 1000 can include, for example, a computer, a laptop computer, a mobile device, a handheld device, a cellular phone (e.g., a smartphone), a tablet device, an interactive monitor, another type of device capable of displaying and/or presenting a graphical user interface, etc. With the graphical user interface 1000, a user can interact to estimate parameters, e.g., in region 1002, and plot/view corresponding results, e.g., in region 1004.)

Figure 11:
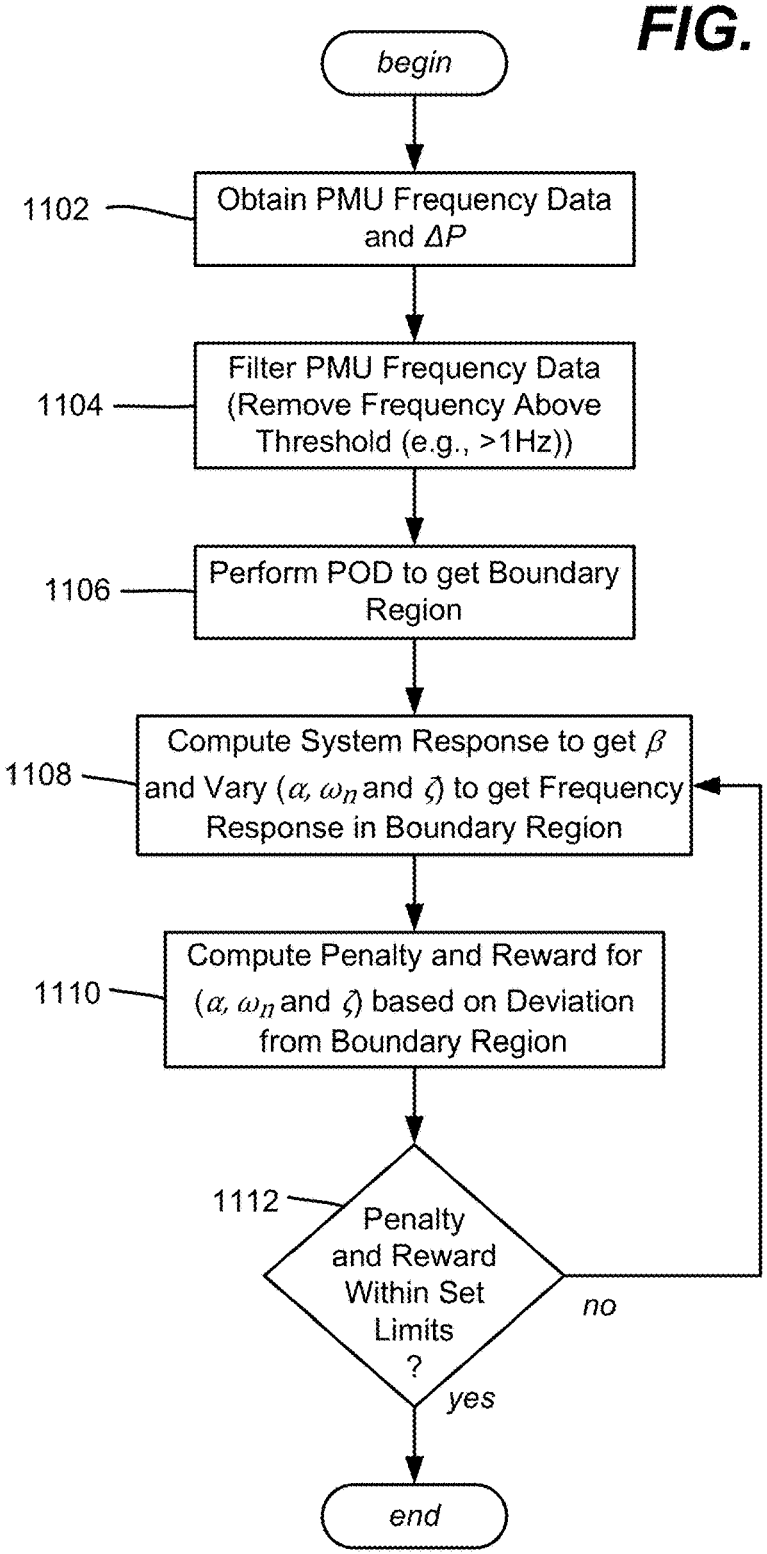
FIG. 11 illustrates example operations that may be used to stabilize frequency in a power grid system in accordance with aspects of the subject disclosure.

In view of the example system(s) described above, example operations that can be implemented in accordance with the disclosed subject matter can be better appreciated with reference to the flow diagram of FIG. 11. For purposes of simplicity of explanation, example operations disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 11 illustrates a methodology for managing frequency response in response to an event that causes an imbalance in the power grid system. At 1102, the PMU frequency data and change in power ($\Delta P$) is obtained, e.g., the frequency data is selected for a relevant timeframe corresponding to the change in power.

At 1104, the PMU's data are filtered based on the frequency represented therein, e.g., to remove PMUs with frequency data above the threshold (e.g., >1 Hz), which may be user-defined.

At 1106, a Proper Orthogonal Decomposition (POD) is performed on the post-filtered data. As is known, a POD analysis reduces high-dimensional data into lower-dimensional representations, which in this example comprises the trend information of the frequency response. This information is used to obtain the boundary region as described herein.

The operation represented by 1108 calculates the system response ($1/\beta=1/R+1/D$) using a low pass filter design. The variables in the rewritten transfer function, namely $\alpha$, $\omega_n$ and $\zeta$ are varied to get the frequency response into the boundary region.

At 1110, the penalty and reward values are computed based on the frequency response deviation from the boundary region. If, as determined at 1112, the values are within the set (e.g., user defined or empirically determined) limits, the process is complete. Otherwise, 1112 returns to 1108 to again compute the system response and vary the variables, and so on, until the frequency response is appropriately within the boundary region.

One or more aspects comprise detecting, by a system comprising a processor, a change in power in a power grid system corresponding to an imbalance in the power grid system that changes a frequency associated with the power grid system, and in response to detecting the change in power, determining a system response value based on phasor measurement unit data associated with the power grid and a change in power value representing the change in power and establishing a boundary region for a frequency response of the power grid system using the phasor measurement unit data. Other aspects comprise using the system response value to obtain transfer function parameters of a transfer function, wherein the transfer function relates the change in power to a change in frequency based on the system response value and the transfer function parameters, and evaluating the frequency response of the power grid system with respect to the boundary region, and in response to the frequency response being determined not to be within the boundary region, varying at least one transfer function parameter of the transfer function parameters until the frequency response is within the boundary region.

Determining the system response value may comprise estimating dynamic response parameters from the phasor measurement unit data and the change in power value. Determining the system response value may comprise computing the system response value based on a first value representative of system droop and a second value representative of system damping.

Establishing the boundary region may comprise filtering frequency data of the phasor measurement unit data. Establishing the boundary region may comprise performing a Proper Orthogonal Decomposition on information corresponding to the phasor measurement unit data to obtain trend information of the frequency response. Establishing the boundary region may comprise filtering frequency data of the phasor measurement unit data to obtain filtered data and performing a Proper Orthogonal Decomposition on the filtered data to obtain trend information of the frequency response.

Varying the at least one transfer function parameter until the frequency response is within the boundary region may comprise determining a penalty for the at least one transfer function parameter based on a deviation from the boundary region, and evaluating the penalty with respect to penalty limit data. Varying the at least one transfer function parameter until the frequency response is within the boundary region may comprise determining a reward for the at least one transfer function parameter based on an adherence to the boundary region, and evaluating the reward with respect to reward limit data. Varying the transfer function's at least one parameter until the frequency response is within the boundary region may comprise determining a penalty for the at least one transfer function parameter based on a deviation from the boundary region, evaluating the penalty with respect to limit data, determining a reward for the at least one transfer function parameter based on an adherence to the boundary region, and evaluating the reward with respect to reward limit data.

Also described is the capability of collecting the phasor measurement unit data.

One or more aspects are directed towards system response calculation logic configured to calculate a system response value in response to a change in power in a power grid, the system response value calculated based on phasor measurement unit data obtained from power grid measurements and a power value representing the change in power. Aspects comprise boundary region logic configured to establish a frequency response boundary region of the power grid from filtered frequency data of the phasor measurement unit data that was filtered using a filter and a Proper Orthogonal Decomposition on the filtered frequency data, and transfer function parameter varying logic configured to vary transfer function parameters of a transfer function and evaluate a frequency response of the power grid with respect to the frequency response boundary region, and, in response to the frequency response being determined not to be within the boundary region, to further vary the transfer function parameters until the frequency response is within the boundary region.

The filter may remove frequencies above a threshold frequency value. The threshold frequency value may be user configurable.

The system response value may be calculated based on the phasor measurement unit data comprising a parameter representing power grid system droop and a parameter representing power grid system damping.

The transfer function parameter varying logic may be further configured to compute a penalty for the transfer function parameters based on a deviation of the transfer function parameters from the boundary region and evaluate the penalty with respect to penalty limit data in a first evaluation, to compute a reward for the transfer function parameters based on an adherence of the transfer function parameters to the boundary region and evaluate the reward with respect to reward limit data in a second evaluation, and wherein the transfer function parameter varying logic varies the transfer function parameters based on at least one of the first evaluation or the second evaluation.

One or more aspects are directed towards determining a system response value in response to detection of a change in power in a power grid represented by a change in power value, comprising estimating dynamic response parameters from the phasor measurement unit data and the change in power value, establishing a boundary region for a frequency response of the power grid using the phasor measurement unit data, comprising filtering frequency data of the phasor measurement unit data to obtain filtered data and processing the filtered data, and varying a transfer function parameter of a transfer function, using the system response value, until the frequency response is within the boundary region.

Processing the filtered data may comprise performing a Proper Orthogonal Decomposition on the filtered data.

The varying the transfer function parameter until the frequency response is within the boundary region may comprise comparing the frequency response relative to the boundary region, which may comprise determining a penalty for the transfer function parameter based on a deviation of the transfer function parameter from the boundary region, and evaluating the penalty with respect to penalty limit data.

Varying the transfer function parameter until the frequency response is within the boundary region may comprise comparing the frequency response relative to the boundary region, which may comprise determining a reward for the transfer function parameter based on an adherence of the transfer function parameter to the boundary region, and evaluating the reward with respect to reward limit data.

Varying the transfer function parameters until the frequency response is within the boundary region may comprise comparing the frequency response relative to the boundary region, which may comprise determining a penalty for the transfer function parameter based on a deviation of the transfer function parameter from the boundary region, evaluating the penalty with respect to limit data, determining a reward for the transfer function parameter based on an adherence of the transfer function parameter to the boundary region, and evaluating the reward with respect to reward limit data.

Figure 12:
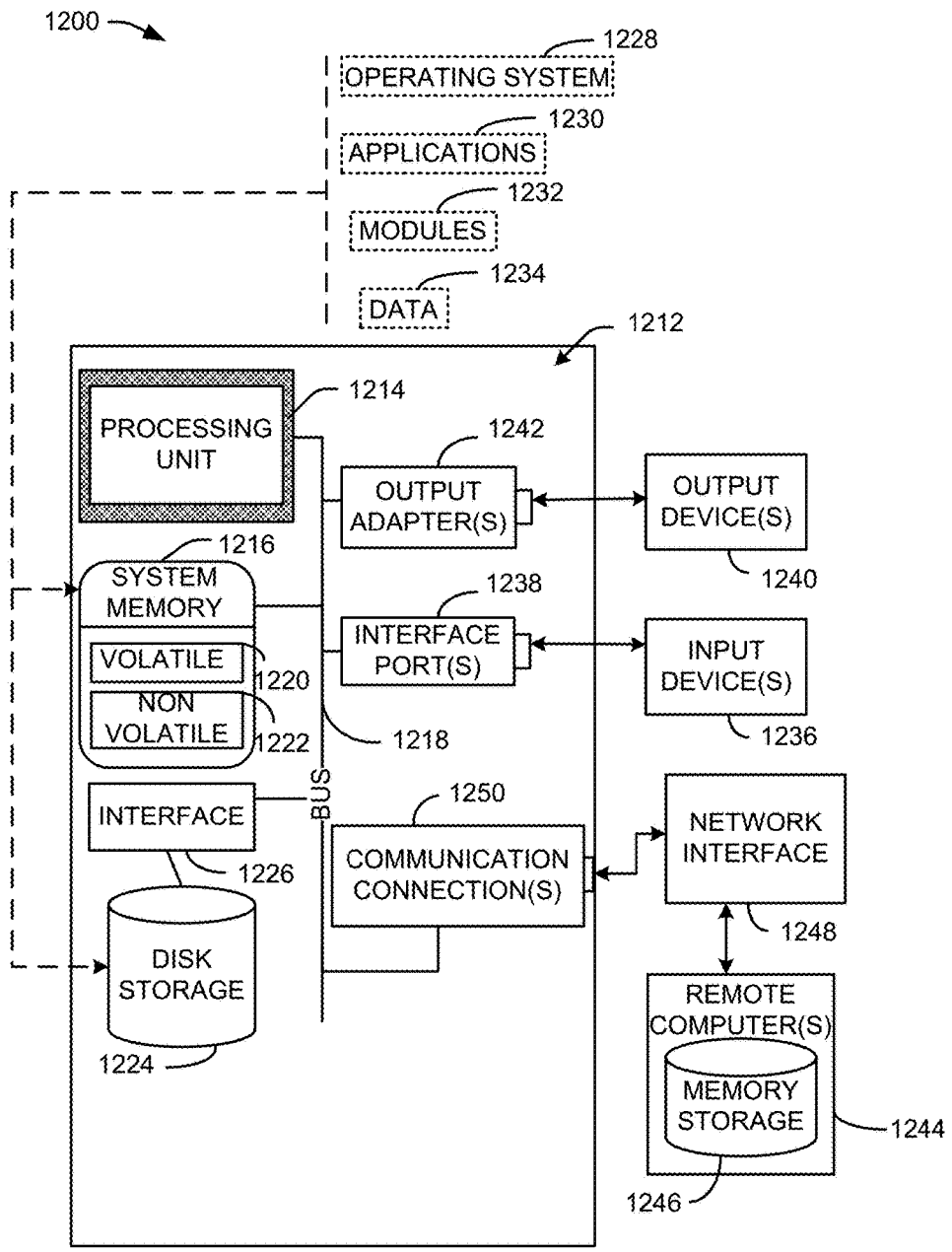
FIG. 12 is a schematic block diagram illustrating a suitable operating environment.

In order to provide a context for the various aspects of the disclosed subject matter, FIG. 12, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and nonvolatile memory, by way of illustration, and not limitation, volatile memory 1220 (see below), non-volatile memory 1222 (see below), disk storage 1224 (see below), and memory storage 1246 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 12 illustrates a block diagram of a computing system 1200 operable to execute the disclosed systems and methods in accordance with an embodiment. Computer 1212 includes a processing unit 1214, a system memory 1216, and a system bus 1218. System bus 1218 couples system components including, but not limited to, system memory 1216 to processing unit 1214. Processing unit 1214 can be any of various available processors. Dual microprocessors and other multiprocessor architectures also can be employed as processing unit 1214.

System bus 1218 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1394), and small computer systems interface.

System memory 1216 can include volatile memory 1220 and nonvolatile memory 1222. A basic input/output system, containing routines to transfer information between elements within computer 1212, such as during start-up, can be stored in nonvolatile memory 1222. By way of illustration, and not limitation, nonvolatile memory 1222 can include read only memory, programmable read only memory, electrically programmable read only memory, electrically erasable read only memory, or flash memory. Volatile memory 1220 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1212 can also include removable/non-removable, volatile/non-volatile computer storage media. FIG. 12 illustrates, for example, disk storage 1224. Disk storage 1224 includes, but is not limited to, devices like a magnetic disk drive, floppy disk drive, tape drive, flash memory card, or memory stick. In addition, disk storage 1224 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1224 to system bus 1218, a removable or non-removable interface is typically used, such as interface 1226.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 12 describes software that acts as an intermediary between users and computer resources described in suitable operating environment 1200. Such software includes an operating system 1228. Operating system 1228, which can be stored on disk storage 1224, acts to control and allocate resources of computer system 1212. System applications 1230 take advantage of the management of resources by operating system 1228 through program modules 1232 and program data 1234 stored either in system memory 1216 or on disk storage 1224. It is to be noted that the disclosed subject matter can be implemented with various operating systems or combinations of operating systems.

A user can enter commands or information into computer 1212 through input device(s) 1236. As an example, a user interface can be embodied in a touch sensitive display panel allowing a user to interact with computer 1212. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1214 through system bus 1218 by way of interface port(s) 1238. Interface port(s) 1238 include, for example, a serial port, a parallel port, a game port, a universal serial bus, an infrared port, a Bluetooth port, an IP port, or a logical port associated with a wireless service, etc. Output device(s) 1240 use some of the same type of ports as input device(s) 1236.

Thus, for example, a universal serial busport can be used to provide input to computer 1212 and to output information from computer 1212 to an output device 1240. Output adapter 1242 is provided to illustrate that there are some output devices 1240 like monitors, speakers, and printers, among other output devices 1240, which use special adapters. Output adapters 1242 include, by way of illustration and not limitation, video and sound cards that provide means of connection between output device 1240 and system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. Remote computer(s) 1244 can be a personal computer, a server, a router, a network PC, cloud storage, cloud service, a workstation, a microprocessor based appliance, a peer device, or other common network node and the like, and typically includes many or all of the elements described relative to computer 1212.

For purposes of brevity, only a memory storage device 1246 is illustrated with remote computer(s) 1244. Remote computer(s) 1244 is logically connected to computer 1212 through a network interface 1248 and then physically connected by way of communication connection 1250. Network interface 1248 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1250 refer(s) to hardware/software employed to connect network interface 1248 to bus 1218. While communication connection 1250 is shown for illustrative clarity inside computer 1212, it can also be external to computer 1212. The hardware/software for connection to network interface 1248 can include, for example, internal and external technologies such as modems, including regular telephone grade modems, cable modems and digital subscriber line modems, integrated services digital network adapters, and Ethernet cards.

Figure 13:
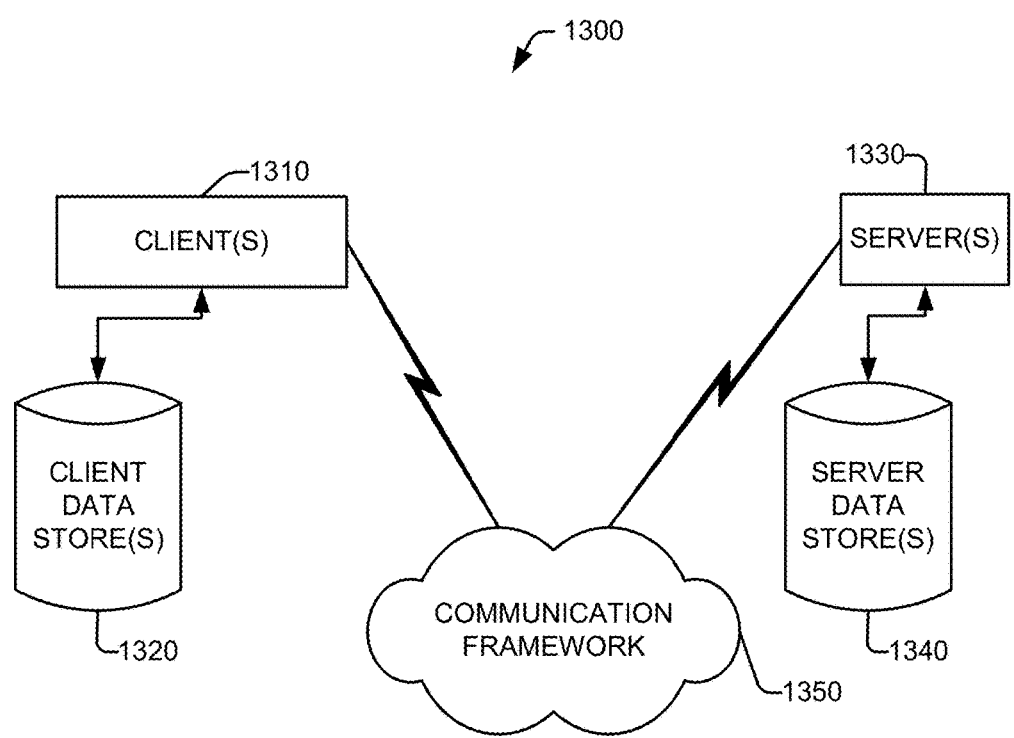
FIG. 13 is a schematic block diagram of an example computing environment.

FIG. 13 is a schematic block diagram of a sample-computing environment 1300 with which the subject matter of this disclosure can interact. The system 1300 includes one or more client(s) 1310. The client(s) 1310 can be hardware and/or software (e.g., threads, processes, computing devices). The system 1300 also includes one or more server(s) 1330. Thus, system 1300 can correspond to a two-tier client server model or a multi-tier model (e.g., client, middle tier server, data server), amongst other models. The server(s) 1330 can also be hardware and/or software (e.g., threads, processes, computing devices). The servers 1330 can house threads to perform transformations by employing this disclosure, for example. One possible communication between a client 1310 and a server 1330 may be in the form of a data packet transmitted between two or more computer processes.

The system 1300 includes a communication framework 1350 that can be employed to facilitate communications between the client(s) 1310 and the server(s) 1330. The client(s) 1310 are operatively connected to one or more client data store(s) 1320 that can be employed to store information local to the client(s) 1310. Similarly, the server(s) 1330 are operatively connected to one or more server data store(s) 1340 that can be employed to store information local to the servers 1330.

Figure 14:
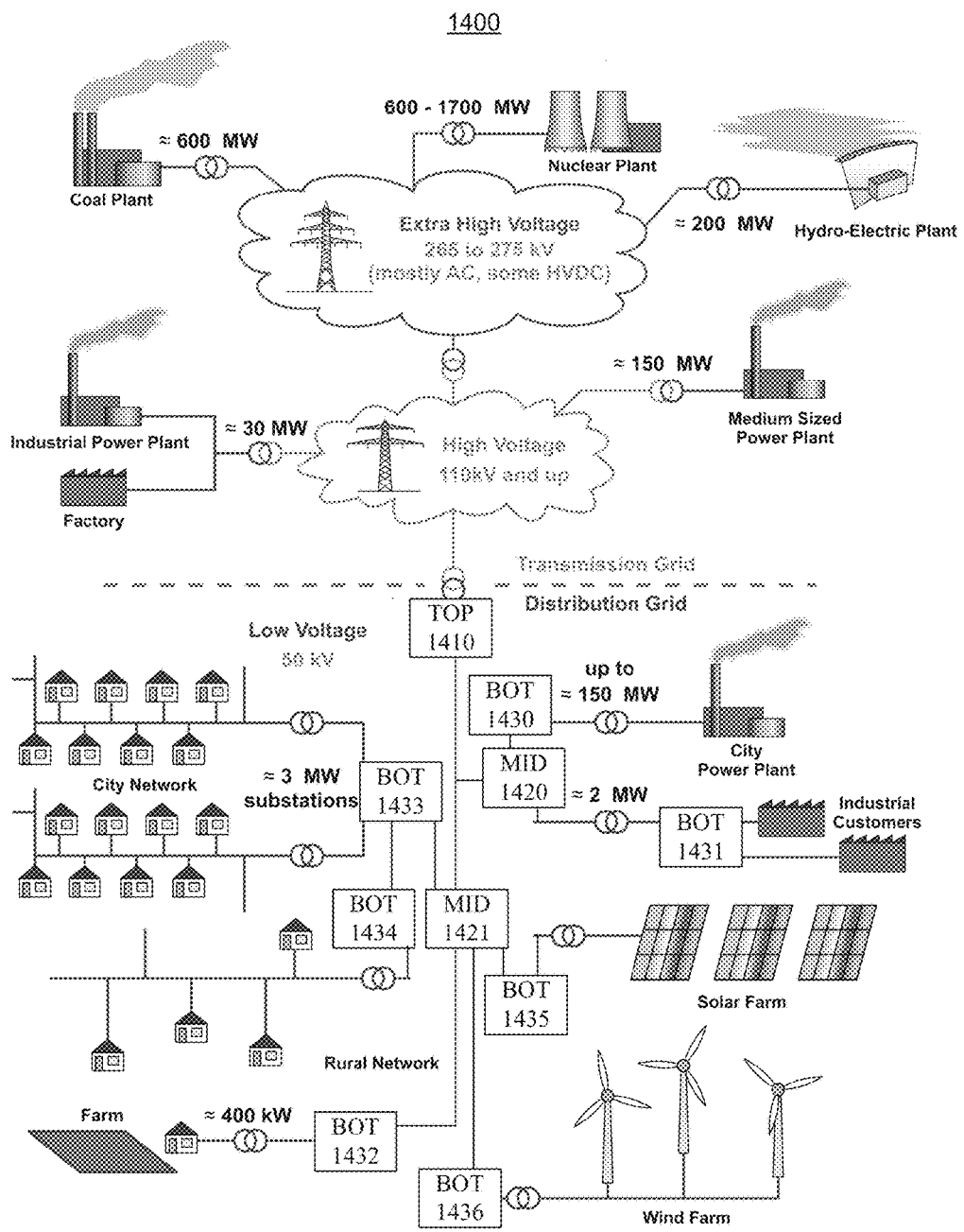
FIG. 14 depicts a diagram of an example electrical grid environment in which the various aspects of the disclosed subject matter may be practiced.

FIG. 14 depicts a diagram of an example electrical grid environment 1400 in which the various aspects of the disclosed subject matter can be practiced. It is to be appreciated that this figure and the associated disclosure is presented as a non-limiting example to facilitate a general comprehension of one or more aspects of the disclosed subject matter in connection with hypothetical electrical grid assets. Further, while sample values and assets are illustrated for context, these same sample values and assets are non-limiting and should not be viewed as defining any narrowing of scope. Generally, the assets of FIG. 14 can be assigned to a transmission grid portion (upper portion of figure) or a distribution grid portion (lower portion of figure) as is typical in many electrical power grids worldwide. Transmission systems often are associated with very high AC voltages or even DC transmission of power. Transmission systems are generally presented in the context of delivering high power to regional distribution networks managed by a distribution grid entity.

The conventional electrical distribution grid, as disclosed herein, generally has a flat control structure with control being centralized in a distribution control center (DCC). In contrast, as illustrated in FIG. 14, a non-flat control topography can be employed in accord with the subject matter disclosed herein. In this non-limiting example, three tiers of electrical distribution control system components are illustrated. A top-level (e.g., upper level) control node 1410 (also referred to as TOP 1410) (e.g., comprising a top-level DNNC component and top-level PSBC) can be communicatively coupled to junior level control nodes (e.g., 1420 to 1436), which can comprise junior level DNNC components and junior level PSBCs. In FIG. 14, the interconnections illustrate a basic tree structure topology.

In an aspect, two mid-level control nodes 1420 (also referred to as MID 1420) and 1421 (also referred to as MID 1421) can be logically placed between the bottom-level (e.g., lower level) control node and the top-level control node 1410. Further, the several bottom-level control nodes, such as bottom-level control nodes 1430 through 1436 (also referred to as BOT 1430 through BOT 1436), can be associated with various edge assets. For example, bottom-level control node 1430 can be associated with a city power plant and bottom-level control node 1431 can be associated with a small group of industrial customers. Bottom-level control node 1430 and 1431 can be logically connected to top-level control node 1410 by way of mid-level control node 1420. As such, data and rules can be bubbled up (e.g., communicated upward in the hierarchy) or pushed down (e.g., communicated downward in the hierarchy) by way of this communication path. The bidirectional communication and closed loop control at each level (e.g., top, mid, and bottom) can facilitate improved electrical distribution grid performance. For example, where additional power is requested by the industrial customers associated with bottom-level control node 1431, control signals from mid-level control node 1420 can source more power from city power plant by way of bottom-level control node 1430 without directly involving the top-level control node 1410 or draining energy from the illustrated solar farm or wind farm.

Similarly, mid-level control node 1421 can be associated with bottom-level control node 1432 through 1436. Bottom-level control node 1433, for example, can be logically associated with a plurality of transformers service a portion of a city network. Further, for example, bottom-level control node 1434 can be associated with a single transformer as part of a rural network. Moreover, at bottom-level control node 1432, for example, the control node can be associated with a single consumer, such as the farm. The control nodes also can be associated with distributed power generation, for example bottom-level control node 1435 associated with a solar farm and bottom-level control node 1436 associated with a wind farm. As such, bidirectional communication between top-level control node 1410 and bottom-level control node 1432 through 1436 can be by way of mid-level control node 1421. As such, rules propagated for mid-level control node 1420 and associate child control nodes can be different from rules propagated for mid-level control node 1421 and associated child control nodes. Further, independent closed loop control can be affected, for example, at bottom-level control node 1434 and the associated rural customers without impacting bottom-level control node 1433 and the associated city network.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects also may be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also may be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "operator," "switchman," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A method, comprising:
   detecting, by a system comprising a processor, a change in power in a power grid system corresponding to an imbalance in the power grid system that changes a frequency associated with the power grid system; and
   in response to detecting the change in power:
      determining a system response value based on phasor measurement unit data associated with the power grid and a change in power value representing the change in power;
      establishing a boundary region for a frequency response of the power grid system using the phasor measurement unit data;
      using the system response value to obtain transfer function parameters of a transfer function, wherein the transfer function relates the change in power to a change in frequency based on the system response value and the transfer function parameters; and
      evaluating the frequency response of the power grid system with respect to the boundary region, and in response to the frequency response being determined not to be within the boundary region, varying at least one transfer function parameter of the transfer function parameters until the frequency response is within the boundary region.

2. The method of claim 1, wherein the determining the system response value comprises estimating dynamic response parameters from the phasor measurement unit data and the change in power value.

3. The method of claim 1, wherein the determining the system response value comprises computing the system response value based on a first value representative of system droop and a second value representative of system damping.

4. The method of claim 1, wherein the establishing the boundary region comprises filtering frequency data of the phasor measurement unit data.

5. The method of claim 1, wherein the establishing the boundary region comprises performing a Proper Orthogonal Decomposition on information corresponding to the phasor measurement unit data to obtain trend information of the frequency response.

6. The method of claim 1, wherein the establishing the boundary region comprises filtering frequency data of the phasor measurement unit data to obtain filtered data and performing a Proper Orthogonal Decomposition on the filtered data to obtain trend information of the frequency response.

7. The method of claim 1, wherein the varying the at least one transfer function parameter until the frequency response is within the boundary region comprises determining a penalty for the at least one transfer function parameter based on a deviation from the boundary region, and evaluating the penalty with respect to penalty limit data.

8. The method of claim 1, wherein the varying the at least one transfer function parameter until the frequency response is within the boundary region comprises determining a reward for the at least one transfer function parameter based on an adherence to the boundary region, and evaluating the reward with respect to reward limit data.

9. The method of claim 1, wherein the varying the transfer function at least one parameter until the frequency response is within the boundary region comprises determining a penalty for the at least one transfer function parameter based on a deviation from the boundary region, evaluating the penalty with respect to limit data, determining a reward for the at least one transfer function parameter based on an adherence to the boundary region, and evaluating the reward with respect to reward limit data.

10. The method of claim 1, further comprising collecting the phasor measurement unit data.

11. A system, comprising:
a memory to store computer-executable components; and
a processor, coupled to the memory, that executes or facilitates execution of computer-executable components, the computer-executable components comprising:
system response calculation logic configured to calculate a system response value in response to a change in power in a power grid, the system response value calculated based on phasor measurement unit data obtained from power grid measurements and a power value representing the change in power;
boundary region logic configured to establish a frequency response boundary region of the power grid from filtered frequency data of the phasor measurement unit data that was filtered using a filter and a Proper Orthogonal Decomposition on the filtered frequency data; and
transfer function parameter varying logic configured to vary transfer function parameters of a transfer function and evaluate a frequency response of the power grid with respect to the frequency response boundary region, and, in response to the frequency response being determined not to be within the boundary region, to further vary the transfer function parameters until the frequency response is within the boundary region.

12. The system of claim 11, wherein the filter removes frequencies above a threshold frequency value.

13. The system of claim 12, wherein the threshold frequency value is user configurable.

14. The system of claim 11, wherein the system response value is calculated based on the phasor measurement unit data comprising a parameter representing power grid system droop and a parameter representing power grid system damping.

15. The system of claim 11, wherein the transfer function parameter varying logic is further configured to compute a penalty for the transfer function parameters based on a deviation of the transfer function parameters from the boundary region and evaluate the penalty with respect to penalty limit data in a first evaluation, to compute a reward for the transfer function parameters based on an adherence of the transfer function parameters to the boundary region and evaluate the reward with respect to reward limit data in a second evaluation, and wherein the transfer function parameter varying logic varies the transfer function parameters based on at least one of the first evaluation or the second evaluation.

16. A machine-readable storage medium, comprising executable instructions that, when executed on a processor, facilitate performance of operations, the operations comprising:
determining a system response value in response to detection of a change in power in a power grid represented by a change in power value, comprising estimating dynamic response parameters from the phasor measurement unit data and the change in power value;
establishing a boundary region for a frequency response of the power grid using the phasor measurement unit data, comprising filtering frequency data of the phasor measurement unit data to obtain filtered data and processing the filtered data; and
varying a transfer function parameter of a transfer function, using the system response value, until the frequency response is within the boundary region.

17. The machine-readable storage medium of claim 16, wherein the processing the filtered data comprises performing a Proper Orthogonal Decomposition on the filtered data.

18. The machine-readable storage medium of claim 16, wherein the varying the transfer function parameter until the frequency response is within the boundary region comprises comparing the frequency response relative to the boundary region, comprising determining a penalty for the transfer function parameter based on a deviation of the transfer function parameter from the boundary region, and evaluating the penalty with respect to penalty limit data.

19. The machine-readable storage medium of claim 16, wherein the varying the transfer function parameter until the frequency response is within the boundary region comprises comparing the frequency response relative to the boundary region, comprising determining a reward for the transfer function parameter based on an adherence of the transfer function parameter to the boundary region, and evaluating the reward with respect to reward limit data.

20. The machine-readable storage medium of claim 16, wherein the varying the transfer function parameters until the frequency response is within the boundary region comprises comparing the frequency response relative to the boundary region, comprising determining a penalty for the transfer function parameter based on a deviation of the transfer function parameter from the boundary region, evaluating the penalty with respect to limit data, determining a reward for the transfer function parameter based on an adherence of the transfer function parameter to the boundary region, and evaluating the reward with respect to reward limit data.

* * * * *